United States Patent [19]

Matsumoto

[11] Patent Number: 5,101,252
[45] Date of Patent: Mar. 31, 1992

[54] PHOTOELECTRIC CONVERTING DEVICE WITH IMPROVED RESETTING TRANSISTOR AND INFORMATION PROCESSING APPARATUS UTILIZING THE SAME

[75] Inventor: Shigeyuki Matsumoto, Atsugi, Japan

[73] Assignee: Canon Kabushiki Kaisha, Tokyo, Japan

[21] Appl. No.: 625,802

[22] Filed: Dec. 11, 1990

[30] Foreign Application Priority Data

Dec. 14, 1989 [JP] Japan .................. 1-324575

[51] Int. Cl.⁵ .............................. H01L 27/14
[52] U.S. Cl. ........................ 357/30; 357/32; 357/58; 250/211 J; 250/578.1
[58] Field of Search .......... 357/30 P, 30 I, 30 G, 357/30 R, 30 D, 30 H, 58, 32, 31; 250/578.1, 211 J

[56] References Cited

U.S. PATENT DOCUMENTS

| | | | |
|---|---|---|---|
| 4,616,249 | 10/1986 | Nishizawa et al. | 357/30 |
| 4,618,874 | 10/1986 | Yamada | 357/30 |
| 4,665,422 | 5/1987 | Hirao et al. | 357/30 |
| 4,743,955 | 5/1988 | Matsumoto | 357/30 |
| 4,791,070 | 12/1988 | Hirao | 437/2 |
| 4,791,469 | 12/1988 | Ohmi et al. | 357/30 |
| 4,794,443 | 12/1988 | Tanaka et al. | 357/43 |
| 4,814,846 | 3/1989 | Matsumoto et al. | 357/30 |
| 4,816,889 | 3/1989 | Matsumoto | 357/30 |
| 4,866,293 | 9/1989 | Nakamura et al. | 250/578 |
| 4,906,856 | 3/1990 | Iwanami et al. | 357/30 G X |
| 4,916,512 | 4/1990 | Ohmi et al. | 357/30 P |
| 4,920,395 | 4/1990 | Muro | 357/30 G |

FOREIGN PATENT DOCUMENTS

| | | |
|---|---|---|
| 0226338 | 6/1987 | European Pat. Off. ......... 357/30 P |
| 2297559 | 1/1989 | European Pat. Off. |
| 3425908 | 3/1985 | Fed. Rep. of Germany |
| 3432801 | 4/1985 | Fed. Rep. of Germany |

*Primary Examiner*—William Mintel
*Attorney, Agent, or Firm*—Fitzpatrick, Cella, Harper & Scinto

[57] ABSTRACT

In a photoelectric converter provided with a phototransistor having at least two main electrode areas of a first conductive type of semiconductor and a control electrode area of a different conductive type of semiconductor, and a field effect transistor having the same control electrode area, a channel area, a main electrode area of the second conductive type and a gate electrode above the channel area, the channel area is formed in a high impurity concentration area of the first conductive type with a depth greater than that of the control electrode area and of the field effect transistor main electrode area. The channel area arrangement provides improved performance and reliability in a photoconverter requiring a large depletion layer.

11 Claims, 5 Drawing Sheets

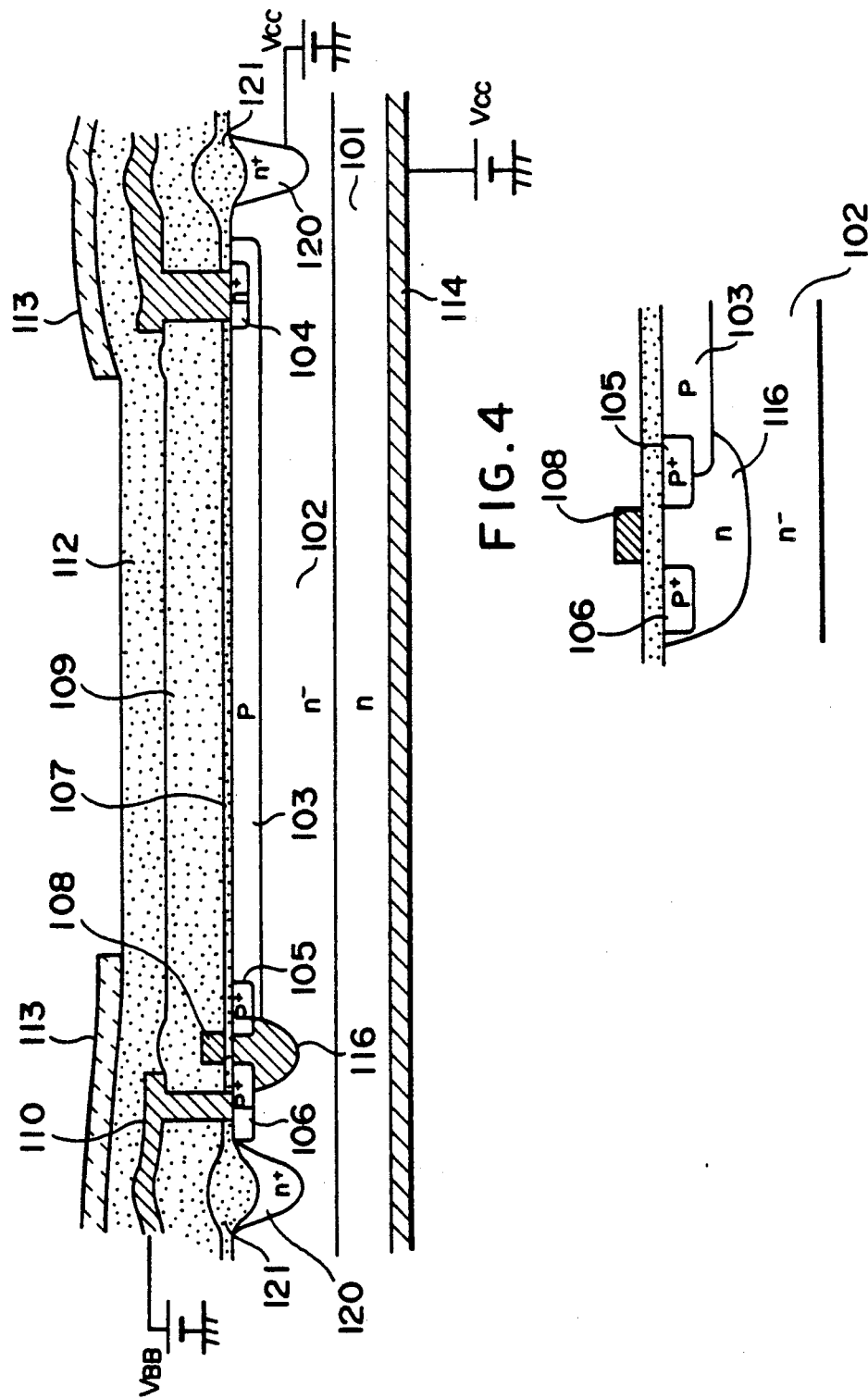

PHOTOELECTRIC CONVERTING DEVICE WITH IMPROVED RESETTING TRANSISTOR AND INFORMATION PROCESSING APPARATUS UTILIZING THE SAME

BACKGROUND OF THE INVENTION

1. Field of the Invention

The present invention relates to a photoelectric converting device for use in an image input apparatus such as video camera, facsimile apparatus, copying machine or image reader, or in an image information processing apparatus such as a range finder of a camera, and more particularly a photoelectric converting device integrally provided with a phototransistor and a transistor for refreshing or resetting said phototransistor.

2. Related Background Art

In the field of photoelectric converting devices having resetting transistors integrally with phototransistors on a same semiconductor substrate, there are already known structures as disclosed in the U.S. Pat. No. 4,791,469 allowed to Tadahiro Ohmi et al., in the U.S. Pat. No. 4,794,443 allowed to Nobuyoshi Tanaka et al., and in the U.S. Pat. No. 4,866,293 allowed to Yoshio Nakamura et al.

FIG. 1A is a schematic cross-sectional view of a conventional photoelectric converting device.

Referring to FIG. 1A, an $n^{3^1}$-layer 102 is formed by epitaxial growth on an n-type semiconductor substrate 101, and said layers 101 and 102 constitute a collector area in each cell. In each cell there is formed a p-base area 103, in which an $n^+$-emitter area 104 is formed to constitute an npn bipolar transistor (BPT) serving as a phototransistor.

In the p-base area 103 there is also formed a $p^+$-source area 105. Also at a certain distance a $p^+$-drain area 106 is formed in the $n^-$-layer 102, and a gate electrode 108 is formed on an oxide film 107 to constitute a resetting p-channel MOS transistor (reset Tr).

Above the bipolar transistor and the resetting transistor, there are formed an insulation film 109, a drain electrode 110 connected to the drain area 106, and an emitter electrode 111 connected to the $n+$-emitter area 104. On these components there is formed an insulation film 112, which is covered by an opaque film 113 except for an aperture. On the bottom side of the substrate 101 there is formed a collector electrode 114.

FIG. 1B is an equivalent circuit diagram of the above-explained photoelectric converting device, in which shown are the collector 201 of the bipolar transistor; collector electrode 202; base 203 of the bipolar transistor; emitter 204 of the bipolar transistor; emitter electrode 205; resetting transistor 206; terminal 207 connected to the drain electrode; and terminal 208 connected to the gate electrode.

In the following there will be explained the basic function, with reference to the equivalent circuit shown in FIG. 1B. It is assumed that the base 203 of the bipolar transistor is in an initial state with a predetermined potential. Then light enters the bipolar transistor, whereby carriers of an amount corresponding to the received amount of light are accumulated in the base 203 (accumulating operation). The potential of the base varies depending on the charge accumulated in the base, and the current between the emitter and collector is controlled by said potential change.

Then an electrical signal corresponding to the amount of incident light is read from the emitter electrode 205 in the floating state (readout operation).

The removal of the carriers accumulated in the base 203 (refreshing operation) is conducted by grounding the emitter electrode 205 and setting the base 203 at the initial base potential through the MOS transistor 206. The carriers in the base area can be dissipated by setting the terminal 207 in advance at a potential corresponding to said initial base potential and turning on the refreshing transistor 206 at the refreshing operation.

Thereafter the operations of accumulation, readout and refreshing are repeated in a similar manner.

As explained above, the photoelectric converting device shown in FIGS. 1A and 1B accumulates the carriers, generated by light irradiation, in the base area and controls the current between the emitter and collector electrodes by the amount of accumulated charge. Such photoelectric converting device can achieve high output, high sensitivity and low noise because the accumulated carriers are read after charge amplification by the bipolar transistor.

Also the potential $V_p$ of the base area generated by the photoexcited carriers accumulated therein is represented by Q/C, wherein Q is the amount of charge of the carriers accumulated in the base while C is the capacitance connected to the base. With a higher level of integration of the photoelectric converting device, both Q and C decrease with the reduction in cell size. Thus the potential $V_p$ generated by photoexcitation remains almost constant even when the level of integration is such photoelectric converting device is improved. Consequently such device is advantageous also for a higher level of resolving power in the future.

In such conventional photoelectric converting device as explained above, the collector area of the bipolar transistor and the channel forming area of the resetting transistor are integrally formed as an $n^-$-area 102. Consequently the impurity concentration of said collector area of the bipolar transistor is same as that of said channel forming area of the resetting transistor.

More specifically, the impurity concentration in the collector area of the bipolar transistor is strongly related with the photosensitivity of the photoelectric converting device and with the KTC noise thereof, and is generally considered preferably within a range from $8 \times 10^{13}$ to $5 \times 10^{15}$ cm$^{-3}$.

However such conventional photoelectric converting device has been associated with the following drawbacks:

(1) During the accumulating operation, the resetting transistor has to be turned off, and, in order to avoid the leak current between the source and drain of the resetting transistor, there is required a sufficiently long gate, which leads to an increased chip size. This is presumably due to an excessively low impurity concentration in the channel forming area of the resetting transistor;

(2) A BT stress test, applying a voltage to the gate of the resetting transistor, shows a larger fluctuation of the threshold voltage $V_{th}$ than in the ordinary MOS transistors. Although the reason for this phenomenon is not yet clear, it is presumably due to a fact that a Poule-Frenkel trap generated by inversion at the oxide film-silicon interface is filled with carriers, thus shifting the threshold voltage $V_{th}$ in a direction facilitating the flow of current;

(3) Because of the low impurity concentration in the channel forming area of the resetting transistor, a concentration in the electric field easily induces a change in the form of PN junctions between the channel forming area and the source and drain areas and results in so-called walking phenomenon of increases in the voltage resistance and the threshold voltage $V_{th}$ with time, so that the performance of the resetting transistor is inevitably unstable.

It is therefore conceivable, as described in the above-mentioned U.S. Pat. No. 4,791,469, to prevent the leak current by impurity doping in a part, where the inversion layer is formed, of the channel. Such structure is shown in FIG. 1C, in which 102' indicates a channel portion doped with impurity.

However such channel doping alone is unable to sufficiently solve the technical drawbacks, because of the following fact, as identified by many experiments conducted by the present inventors.

Because the resetting MOS transistor is integrally constructed with the phototransistor, the usual parameters of gate length, gate width and threshold voltage in the isolated MOS transistor cannot be applied to such resetting transistor. More specifically, since the $n^{--}$-layer 102 of low impurity concentration and the n-layer 102 under the application of the collector voltage are positioned below the channel, the depletion layers DL become mutually connected in a position PT deeper than the drain area 106 and the source (base) area 105 as shown in FIG. 1C, thus causing a punch-through phenomenon.

SUMMARY OF THE INVENTION

An object of the present invention is to eliminate the technical drawbacks of the conventional photoelectric converting device, and to provide a photoelectric converting device with a smaller resetting transistor and with a stable threshold voltage, and an information processing apparatus utilizing such photoelectric converting device.

Another object of the present invention is to provide a photoelectric converting device capable of satisfactory accumulation and refreshing of the photogenerated carriers, and an information processing apparatus utilizing said photoelectric converting device.

Still another object of the present invention is to provide a photoelectric converting device improved in photosensitivity, capable of forming large depletion layers without punch-through of the resetting transistor, and an information processing apparatus utilizing said photoelectric converting device.

Still another object of the present invention is to provide a photoelectric converting device provided with a phototransistor having at least two main electrode areas of a semiconductor of a first conductive type and a control electrode area of a second conductive type different from said first conductive type; and a field effect transistor having said control electrode area, a channel area, a main electrode area of the second conductive type, and a gate electrode formed on said channel area; wherein said channel area is composed of a high impurity concentration area of the first conductive type with a depth larger than that of said control electrode area and that of said main electrode area of the field effect transistor. Such improvement in the channel area higher performance and higher reliability in the photoelectric converting device requiring formation of large depletion layers.

BRIEF DESCRIPTION OF THE DRAWINGS

FIG. 3 is a schematic cross-sectional view of a photoelectric converting device constituting a second embodiment of the present invention;

FIG. 4 is a schematic cross-sectional view of another embodiment of PMOS transistor.

DETAILED DESCRIPTION OF THE PREFERRED EMBODIMENTS

In the photoelectric converting device of the present invention, in a semiconductor area of the first conductive type for forming the collector area of the bipolar transistor and the channel forming area of the resetting transistor, a specified area including said channel forming area is given a higher impurity concentration whereby optimum impurity concentrations can be selected respectively for said collector area and said channel forming area. It is therefore rendered possible to reduce the gate width of the resetting transistor and to stabilize the threshold voltage thereof in the photoelectric converting device.

Now the present invention will be clarified in detail by embodiments thereof shown in the attached drawings.

FIRST EMBODIMENT

Figure 1:
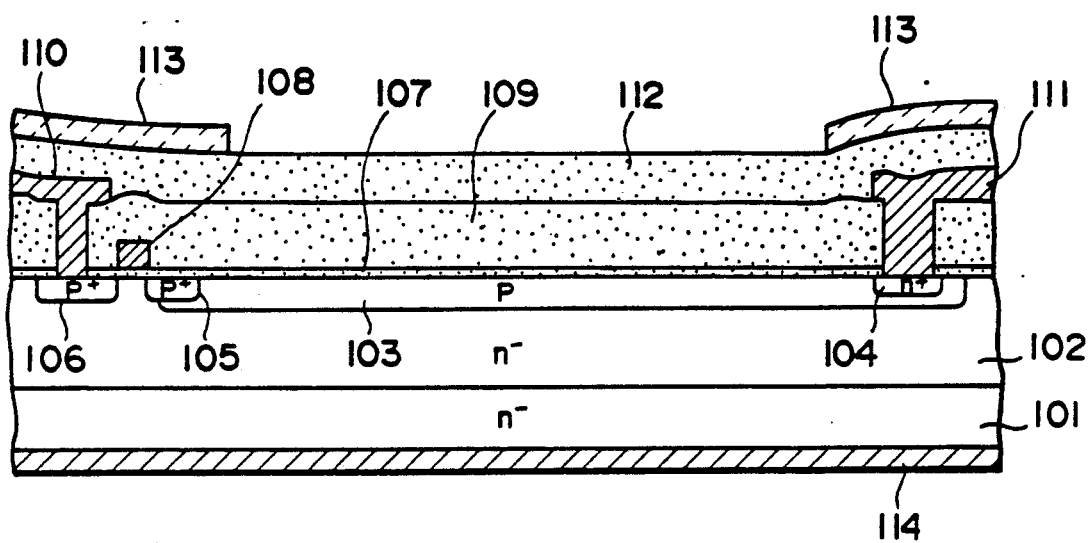
FIG. 1A is a schematic cross-sectional view of a conventional photoelectric converting device.
FIG. 1B is an equivalent circuit diagram of the photoelectric converting device shown in FIG. 1A.
FIG. 1C is a magnified partial cross-sectional view of the photoelectric converting device shown in FIG. 1A.
Figure 1:
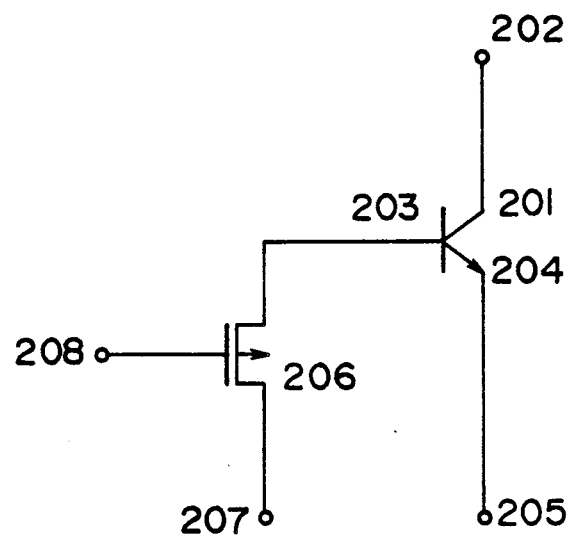
Figure 1:
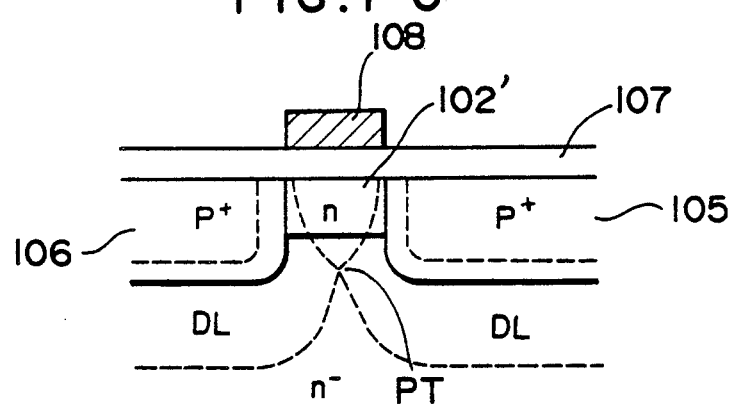
Figure 2:
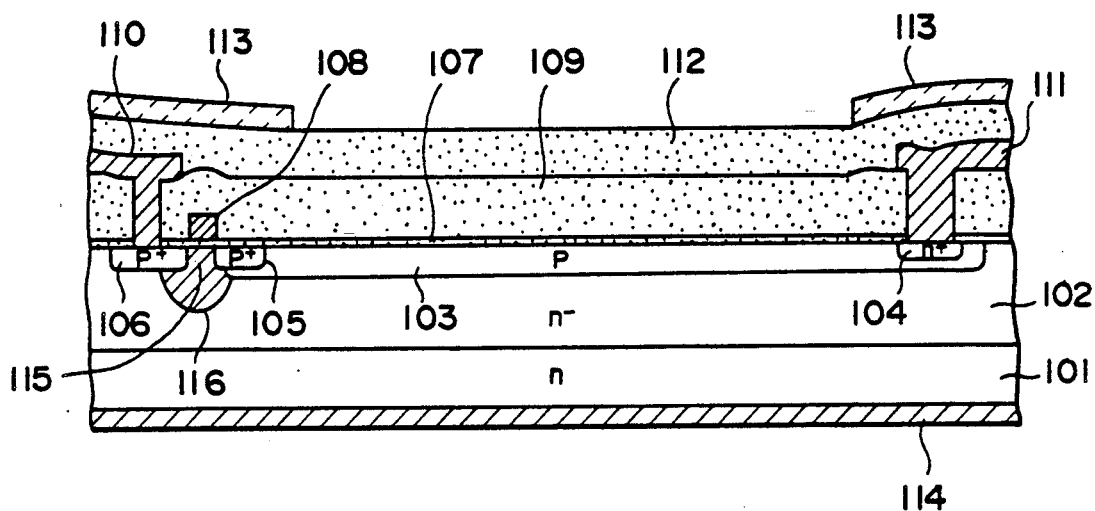
FIG. 2 is a schematic cross-sectional view of a photoelectric converting device constituting a first embodiment of the present invention.

FIG. 2 is a schematic cross-sectional view of a photoelectric converting device constituting a first embodiment, wherein same components as those in FIG. 1 are represented by same numbers. There are also shown a channel forming area 115 of the resetting transistor, and an n-well area 116 so formed as to include the channel area.

As shown in FIG. 2, said n-well area 116 is formed deeper than the source and drain areas 105, 106, thereby completely separating a depletion layer, formed by the junction of the drain area 106 and the $n^{-}$-layer 102, from a depletion layer, formed by the junction of the source (base) area 105 and the $n^{-}$-layer 102.

The impurity concentration of the $n^{-}$-area serving as the collector area of the bipolar transistor is preferably in a range from $8 \times 10^{13}$ to $5 \times 10^{15}$ cm$^{-3}$, in consideration of the relation with the photosensitivity and KTC noises of the photoelectric converting device. On the other hand, the impurity concentration of the channel forming area 115 of the resetting transistor is determined in consideration of the impurity concentrations in the source and drain areas 105, 106 of the resetting transistor, the gate width and the voltage resistance thereof, but is generally selected equal to or higher than $1 \times 10^{15}$ cm$^{-3}$. Consequently the impurity concentration of the n-area 116 is preferably in a range from $1 \times 10^{15}$ to $10^{17}$ cm$^{-3}$.

As explained above, the present embodiment allows the gate length of the resetting transistor to be reduced and stabilization of the threshold voltage, thereby providing a photoelectric converting device of a reduce chip size and with improved stability of operation.

The formation of said n-well area 116 is possible in most cases within the manufacturing process. It is naturally possible to add a step for said formation of the n-well area. However, if simplification of the process is imperative, an area of higher impurity concentration is formed within the channel area of the resetting transistor preferably in a step for channel stop (n-type) formation or for contact (CN+) formation in the bipolar process.

SECOND EMBODIMENT

In the following there will be explained a second embodiment of the present invention with reference to FIG. 3, which is a schematic cross-sectional view of a photoelectric converting device of said embodiment, wherein said components as those in FIG. 2 are represented by same numbers.

An element isolation area 120 of n+-type semiconductor is so formed as to surround a light-receiving cell, and is positioned under a field oxide film 121 formed by selective oxidation. Said area is so constructed as to receive a voltage Vcc, the same as that applied to the collector area outside the light-receiving area. A reference voltage source $V_{BB}$ is provided for fixing the potential of the base area.

The channel area 116, positioned deeper than the source and drain areas 105, 106, is formed in the same step as that for formation of the isolation area 120 as explained above, and serves to avoid the mutual contact of depletion layers in a deep position.

In the photoelectric converting device of the present embodiment, the source and drain areas 105, 106 are made particularly shallower than the base area 103. The n-well area 116, serving to avoid the mutual contact of depletion layers below the source and drain areas, may be formed only below an area between the source and drain as shown in FIG. 3, or it may also be so formed as to surround the source and drain areas 105, 106 as shown in FIG. 4.

What is important is a fact that an area of higher impurity concentration than in the epitaxial layer extends deeper than at least either of the source and drain areas.

The above-explained structure of the present invention is particularly effective in the present embodiment, as the device is operated with a reference voltage Vcc of about +5 V and with a reference voltage $V_{BB}$, supplied to the drain of the PMOS transistor, of about $0 - +2$ V smaller than Vcc. Consequently a photoelectric converting device with higher performance and higher reliability can be provided without sacrificing the advantages of reduction of fixed pattern noises and high photosensitivity. Also in order to minimize the undesirable influence of the n-well area 116 on the photosensitivity, an opaque layer 113 is formed on said area 116. Thus it is desirable to form the area 116 and the PMOS transistor (105, 116, 106, 108) outside the effective photoelectric conversion area.

MANUFACTURING PROCESS

At first, on an n-silicon substrate 101, the n⁻-layer 102 is epitaxially grown.

Then phosphor ions are implanted simultaneously into the areas where the isolation area 120 and the n-well area 116 are to be formed, and the field oxide film 121 is then formed by selective oxidation.

Then boron ions are implanted to form the P-base area 103.

After the formation of the gate insulation film, there is formed the gate electrode 108 composed of polysilicon.

Then boron ions are again implanted to form the source and drain areas 105, 106.

Subsequently the wirings are formed by repeating the formation of insulation film, formation of contact holes, formation of conductive layer and patterning.

More specifically, there is employed an n-silicon substrate with an impurity concentration at least equal to $1 \times 10^{15}$ cm$^{-3}$.

The epitaxial layer has a thickness within a range of 4–20 μm, and an impurity concentration within a range of $1 \times 10^{14}$–$10^{16}$ cm$^{-3}$.

The ranges of thickness and impurity concentration of other areas are shown in the following table:

| Area | Thickness | Impurity concentration |
| --- | --- | --- |
| p-base area 103 | 0.6–2.5 μm | $10^{15}$–$10^{17}$ cm$^{-3}$ |
| n-well area 116 | 0.5–10 μm | $10^{15}$–$10^{17}$ cm$^{-3}$ |
| source/drain areas 105, 106 | 0.1–1.0 μm | $10^{15}$–$10^{20}$ cm$^{-3}$ |

Figure 5:
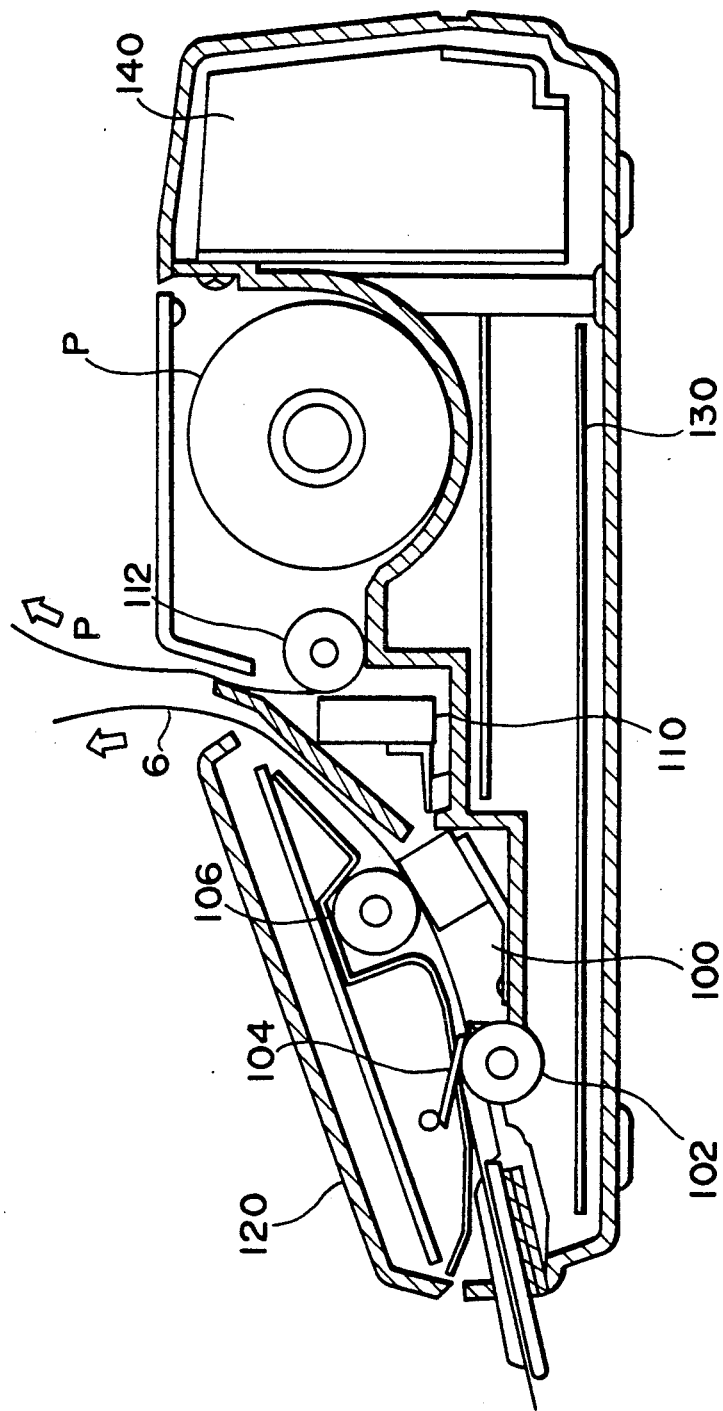
FIG. 5 is a schematic cross-sectional view of an information processing apparatus of the present invention.

The thickness and impurity concentration of each area are selected suitably within the ranges shown in the table above, in consideration of the mutual relationship shown in FIG. 2 or 5.

A sensor module is formed by arranging a plurality of the above-described photoelectric converting devices in a linear or staggered pattern, and a sensor unit is constructed by housing said sensor module in an aluminum casing, together with a light source such as an LED array and an optical system such as a short-focus imaging element array.

FIG. 5 illustrates a facsimile apparatus as an example of the image information processing apparatus employing the sensor unit of the present embodiment. There are shown a feed roller 102 for feeding an original document 6 toward a reading position; a separating member 104 for securely separating the original documents 6 one by one; and a platen roller 106 positioned at the reading position opposed to the sensor unit, thereby defining the image reading plane of the original document 6 and also serving as means for transporting said original document 6.

A recording medium P, composed of rolled paper in the illustrated example, is used for reproducing the image information read by the sensor unit or transmitted from the outside in case of facsimile function. A recording head 110, constituting recording means for image formation, can be of various types such as a thermal head, or an ink jet recording head. Said recording head can be of serial type or line type. A platen roller 112, positioned at the recording position opposed to the recording head, serves to transport the recording medium P and to define the recording plane thereof.

An operation panel 120, serving as input/output means, is provided with switches for entering instructions for operation and a display unit for displaying the status of the apparatus for example by messages.

A system control board 130, serving as control means, is equipped with a controller for controlling various units of the apparatus, a driver circuit for the photoelectric converting device, an image information processing unit, a transmission/reception unit etc. 140 is a power supply unit of the apparatus.

Preferred recording means for use in the information processing apparatus of the present invention is the one of which representative principle and structure are disclosed for example in the U.S. Pat. Nos. 4,723,129 and 4,740,796. Said recording means is based on providing an electrothermal converting element, positioned corresponding to a sheet or a liquid path containing liquid (ink) therein, with at least a drive signal corresponding to the recording information and generating thermal energy for inducing a rapid temperature increase in said liquid enough for exceeding nucleus boiling phenomenon and causing membrane boiling on a thermal action plane of the recording head, thereby forming bubbles in said liquid, respectively corresponding to said drive signals. By the expansion and contraction of said bubble, the liquid (ink) is discharged from a discharge opening to form at least a liquid droplet.

There may also be employed so-called full line type recording head, having a length corresponding to the maximum width of the recording medium recordable on the recording apparatus. Such recording head may be obtained by the combination of plural recording heads disclosed in the above-mentioned patents, or by an integral structure.

The present invention is furthermore effective for a replaceable chip-type recording head which can receive electric and ink supply from the recording apparatus itself when mounted thereon, or a cartridge-type recording head integral with an ink cartridge.

As explained in the foregoing, the present invention provides a more compact photoelectric converting device of high performance. Such device is adapted for use in a compact copying machine or a compact facsimile apparatus, particularly in combination with an ink jet recording head utilizing thermal energy, which is also suitable for compactization.

The present invention is not limited to the foregoing embodiments, bus includes any and all variations. For example the phototransistor can be composed of a field effect transistor instead of the bipolar transistor.

We claim:

1. A photoelectric converting device provided with a phototransistor having at least two main electrode regions (101, 104) of a semiconductor of a first conductive type, a semiconductor region (102) composed of a semiconductor having the same conductive type as and a lower impurity concentration than the main electrode regions and a control electrode region (103) (105) of a semiconductor of a second conductive type different from said first conductive type; and a field effect transistor having said control electrode region (103) (105), a region (116) being capable of forming a channel area, a region (106) of a semiconductor of the second conductive type, an gate electrode (108) formed on said channel area;
   wherein said region (116) capable of forming the channel area is composed of a semiconductor having the same conductive type as and a higher impurity concentration than the lower impurity concentration semiconductor region (102) of said phototransistor, with a maximum depth larger than that of either of said control electrode region (105) and said second conductive type semiconductor region (106) of said field effect transistor, and wherein an opaque layer (113) is provided on said region (116) capable of forming the channel.

2. A device according to claim 1, wherein an area having a higher resistance than one of the main electrode regions is formed between the one (101) of said main electrode regions and said control electrode region, and said channel area forming region (116) is formed in said high resistance area.

3. A device according to claim 1, wherein said phototransistor and said field effect transistor are surrounded by an element isolation area (120) of semiconductor of the first conductive type.

4. A device according to claim 1, wherein said second conductive type semiconductor region (106) of said field effect transistor is formed in said channel area.

5. A device according to claim 1, wherein one (101) of said main electrode regions is so formed as to be connectable with a first reference voltage source ($V_{cc}$), and said second conductive type semiconductor region (106) of said field effect transistor is so formed as to be connectable with a second reference voltage source ($V_{BB}$).

6. An apparatus comprising:
   a photoelectric converting device provided with a phototransistor having at least two main electrode regions (101, 104) of a semiconductor of a first conductive type, a semiconductor region (102) composed of a semiconductor having the same conductive type as and a lower impurity concentration than the main electrode regions and a control electrode region (103) (105) of a semiconductor of a second conductive type different from said first conductive type; and a field effect transistor having said control electrode region (103) (105), a region (116) being capable of forming a channel area, a region (106) of a semiconductor of the second conductive type, and a gate electrode (108) formed on said channel area;
   wherein said region (116) capable of forming the channel area is composed of a semiconductor having the same conductive type as and a higher impurity concentration than the lower impurity concentration semiconductor region (102) of said phototransistor, with a maximum depth larger than that of either of said control electrode region (105) and said second conductive type semiconductor region (106) of said field effect transistor, and wherein an opaque layer (113) is provided on said region (116) capable of forming the channel; and
   an optical system for focusing an image on said device.

7. An apparatus comprising:
   a plurality of photoelectric converting devices, each photoelectric converting device provided with a phototransistor having at least two main electrode regions (101, 104) of a semiconductor of a first conductive type, a semiconductor region (102) composed of a semiconductor having the same conductive type as and a lower impurity concentration than the main electrode regions and a control electrode region (103) (105) of a semiconductor of a second conductive type different from said first conductive type; and a field effect transistor having said control electrode region (103) (105), a region (116) being capable of forming a channel area, a region (106) of a semiconductor of the second conductive type, and a gate electrode (108) formed on said channel area;

wherein said region (116) capable of forming the channel area is composed of a semiconductor having the same conductive type as and a higher impurity concentration than the lower impurity concentration semiconductor region (102) of said phototransistor, with a maximum depth larger than that of either of said control electrode region (105) and said second conductive type semiconductor region (106) of said field effect transistor, and wherein an opaque layer (113) is provided on said region (116) capable of forming the channel;

a light source; and an optical system for focusing an image on said devices.

8. An information processing apparatus comprising:

a plurality of photoelectric converting devices, each photoelectric converting device provided with a phototransistor having at least two main electrode regions (101, 104) of a semiconductor of a first conductive type, a semiconductor region (102) composed of a semiconductor having the same conductive type as and a lower impurity concentration than the main electrode regions and a control electrode region (103) (105) of a semiconductor of a second conductive type different from said first conductive type; and a field effect transistor having said control electrode region (103) (105), a region (116) being capable of forming a channel area, a region (106) of a semiconductor of the second conductive type, and a gate electrode (108) formed on said channel area;

wherein said region (116) capable of forming the channel area is composed of a semiconductor having the same conductive type as and a higher impurity concentration than the lower impurity concentration semiconductor region (102) of said phototransistor, with a maximum depth larger than that of either of said control electrode region (105) and said second conductive type semiconductor region (106) of said field effect transistor, and wherein an opaque layer (113) is provided on said region (116) capable of forming the channel;

a light source;

an optical system for focusing an image on said devices;

means for supporting an original bearing image information to be read by said apparatus; and means for recording the image information read by said apparatus.

9. An information processing apparatus according to claim 8, wherein said recording means is an ink jet recording head.

10. An information processing apparatus according to claim 9, wherein said recording head is a recording head adapted to discharge ink utilizing thermal energy.

11. A photoelectric converting device provided with a phototransistor having at least two main electrode regions (101, 104) of a semiconductor of a first conductive type, a semiconductor region (102) composed of a semiconductor having the same conductive type as and a lower impurity concentration than the main electrode regions and a control electrode region (103) (105) of a semiconductor of a second conductive type different from said first conductive type; and a field effect transistor having said control electrode region (103) (105), a region (116) being capable of forming a channel, a region (106) of a semiconductor of the second conductive type, and a gate electrode (108) formed on said channel;

wherein said region (116) capable of forming a channel is composed of a semiconductor having the same conductive type as and a higher impurity concentration than the lower impurity concentration semiconductor region (102) of said phototransistor, with a maximum depth larger than that of either of said control electrode region (105) and said second conductive type semiconductor region (106) of said field effect transistor, and wherein said region (116) capable of forming the channel has the impurity concentration and depth sufficient to prevent connecting a depletion layer formed by said second conductive type semiconductor region (106) of the field effect transistor and said lower impurity concentration semiconductor region (102) of said phototransistor, and a depletion layer formed by said control electrode region (103, 105) and said lower impurity concentration semiconductor region (102) of said field effect transistor under said region (116) capable of forming a channel to cause punch-through.

* * * * *

UNITED STATES PATENT AND TRADEMARK OFFICE
CERTIFICATE OF CORRECTION

PATENT NO. : 5,101,252

DATED : March 31, 1992

INVENTOR(S) : SHIGEYUKI MATSUMOTO

It is certified that error appears in the above-identified patent and that said Letters Patent is hereby corrected as shown below:

Title page, item,

[56] REFERENCES CITED

Under FOREIGN PATENT DOCUMENTS:
"2297559  1/1989  European Pat. Off. ." should read
--0297559  1/1989  European Pat. Off. .--.

COLUMN 1

Line 29, "$n^{31}$-layer" should read --$n^-$-layer--.

COLUMN 3

Line 68, "area" should read --area provides--.

COLUMN 7

Line 44, "bus" should read --but--.
Line 47, "We claim:" should read --I claim:--.

UNITED STATES PATENT AND TRADEMARK OFFICE
CERTIFICATE OF CORRECTION

PATENT NO. : 5,101,252
DATED : March 31, 1992
INVENTOR(S) : SHIGEYUKI MATSUMOTO

It is certified that error appears in the above-identified patent and that said Letters Patent is hereby corrected as shown below:

<u>COLUMN 8</u>

Line 9, "are" should read --area--.

Signed and Sealed this

Third Day of August, 1993

Attest:

MICHAEL K. KIRK

*Attesting Officer*    Acting Commissioner of Patents and Trademarks